United States Patent
Mehandru et al.

(10) Patent No.: US 10,529,827 B2
(45) Date of Patent: Jan. 7, 2020

(54) LONG CHANNEL MOS TRANSISTORS FOR LOW LEAKAGE APPLICATIONS ON A SHORT CHANNEL CMOS CHIP

(71) Applicant: Intel Corporation, Santa Clara, CA (US)

(72) Inventors: Rishabh Mehandru, Portland, OR (US); Patrick Morrow, Portland, OR (US); Paul B. Fischer, Portland, OR (US); Aaron D. Lilak, Beaverton, OR (US); Stephen M. Cea, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 9 days.

(21) Appl. No.: 15/748,842

(22) PCT Filed: Sep. 25, 2015

(86) PCT No.: PCT/US2015/052465
§ 371 (c)(1),
(2) Date: Jan. 30, 2018

(87) PCT Pub. No.: WO2017/052650
PCT Pub. Date: Mar. 30, 2017

(65) Prior Publication Data
US 2018/0226492 A1 Aug. 9, 2018

(51) Int. Cl.
*H01L 29/66* (2006.01)
*H01L 29/78* (2006.01)
(Continued)

(52) U.S. Cl.
CPC ............ *H01L 29/66666* (2013.01); *H01L 21/823821* (2013.01); *H01L 21/823885* (2013.01);
(Continued)

(58) Field of Classification Search
CPC combination set(s) only.
See application file for complete search history.

(56) References Cited

U.S. PATENT DOCUMENTS

| | | | | |
|---|---|---|---|---|
| 6,049,106 A | * | 4/2000 | Forbes | ............... H01L 29/6675 257/329 |
| 7,151,024 B1 | * | 12/2006 | Forbes | ............... H01L 27/108 438/242 |

(Continued)

OTHER PUBLICATIONS

International Preliminary Search Report for International Patent Application No. PCT/US2015/052465, dated Apr. 5, 2018, 7 pages.
(Continued)

*Primary Examiner* — Steven H Loke
*Assistant Examiner* — Juanita B Rhodes
(74) *Attorney, Agent, or Firm* — Schwabe, Williamson & Wyatt, P.C.

(57) ABSTRACT

Embodiments of the invention include vertically oriented long channel transistors and methods of forming such transistors. In one embodiment, a method of forming such a transistor may include forming a fin on a semiconductor substrate. Embodiments may also include forming a spacer over an upper portion of the fin and a lower portion of the fin not covered by the spacer may be exposed. Embodiments may also include forming a gate dielectric layer over the exposed portion of the fin. A gate electrode may then be deposited, according to an embodiment. Embodiments may include exposing a top portion of the fin and forming a first source/drain (S/D) region in the top portion of the fin. The second S/D region may be formed by removing the semiconductor substrate to expose a bottom portion of the fin and forming the second S/D region in the bottom portion of the fin.

20 Claims, 11 Drawing Sheets

(51) Int. Cl.
*H01L 29/786* (2006.01)
*H01L 21/8238* (2006.01)

(52) U.S. Cl.
CPC .... *H01L 29/66742* (2013.01); *H01L 29/7827* (2013.01); *H01L 29/78642* (2013.01)

(56) References Cited

U.S. PATENT DOCUMENTS

| | | | | |
|---|---|---|---|---|
| 7,271,052 B1* | 9/2007 | Forbes | ............... | H01L 27/10802 257/296 |
| 2002/0130686 A1* | 9/2002 | Forbes | ............... | H01L 27/11807 326/98 |
| 2003/0227072 A1* | 12/2003 | Forbes | ............ | H01L 21/823885 257/616 |
| 2007/0018206 A1* | 1/2007 | Forbes | ............... | H01L 27/10876 257/288 |
| 2012/0052640 A1* | 3/2012 | Fischer | ........... | H01L 21/823425 438/268 |
| 2012/0238061 A1 | 9/2012 | Fischer et al. | | |
| 2013/0134481 A1 | 5/2013 | Bhuwalka et al. | | |
| 2013/0140637 A1 | 6/2013 | Chang et al. | | |
| 2013/0161756 A1 | 6/2013 | Glass et al. | | |
| 2014/0061820 A1 | 3/2014 | Reznicek et al. | | |
| 2014/0166981 A1* | 6/2014 | Doyle | ............... | H01L 29/66666 257/24 |
| 2015/0364381 A1* | 12/2015 | Choi | ............... | H01L 21/823487 438/268 |
| 2016/0013292 A1* | 1/2016 | Choi | ................. | H01L 29/66492 257/329 |
| 2016/0284712 A1* | 9/2016 | Liaw | .................. | H01L 27/1104 |

OTHER PUBLICATIONS

International Search Report and Written Opinion for International Patent Application No. PCT/US2015/052465 dated Jun. 24, 2016, 8 pgs.

* cited by examiner

LONG CHANNEL MOS TRANSISTORS FOR LOW LEAKAGE APPLICATIONS ON A SHORT CHANNEL CMOS CHIP

CROSS-REFERENCE TO RELATED APPLICATION

This patent application is a U.S. National Phase Application under 35 U.S.C. § 371 of International Application No. PCT/US2015/052465, filed Sep. 25, 2015, entitled "LONG CHANNEL MOS TRANSISTORS FOR LOW LEAKAGE APPLICATIONS ON A SHORT CHANNEL CMOS CHIP," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to long channel metal oxide semiconductor (MOS) transistors that are formed on short channel complementary metal-oxide semiconductor (CMOS) chips and methods for manufacturing such devices.

BACKGROUND OF THE INVENTION

Short channel transistors are suitable for several different applications, such as complementary metal-oxide semiconductor (CMOS) devices. However, leakage current when a short channel transistor is in the off-state may be unacceptable for some applications. For example, low-leakage transistors may be desirable for applications such as analog/RF, EDRAM, or the like. Additionally, in some applications, both short-channel devices and long-channel devices are needed on the same semiconductor chip. However, the top down footprint of both transistor types are not able to be fabricated with a single process flow. For example, when an analog/RF transistor is needed on the same chip as a CMOS device, the analog/RF transistors need to be stacked together to reduce the total leakage. The stacking required for the analog/RF transistors produces a larger top down footprint than the footprint needed for CMOS transistors. Additionally, when the leakage requirements are exceptionally low (e.g., DRAM and EDRAM) the transistors cannot be fabricated on the same chip unless additional lithography operations are included in the processing. These additional processes operations greatly increase the cost of the chip and reduce throughput.

Thus, improvements are needed in the formation of long-channel and short-channel transistors on the same semiconductor chip.

DETAILED DESCRIPTION OF THE INVENTION

Described herein are systems that include a semiconductor device and methods of forming such semiconductor devices. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

In order to allow for the inclusion of long channel transistor devices on the same chip as short channel CMOS devices, embodiments of the invention include transistors that have a channel that is oriented vertically in a fin. As such, vertical fins that are used in non-planar CMOS transistors may also be utilized for the long channel devices. Furthermore, the use of fins for long channel devices allows for the vertically oriented channel to be any desired length (up to approximately the height of the fin) without taking up expensive real estate on the chip.

Figure 1:
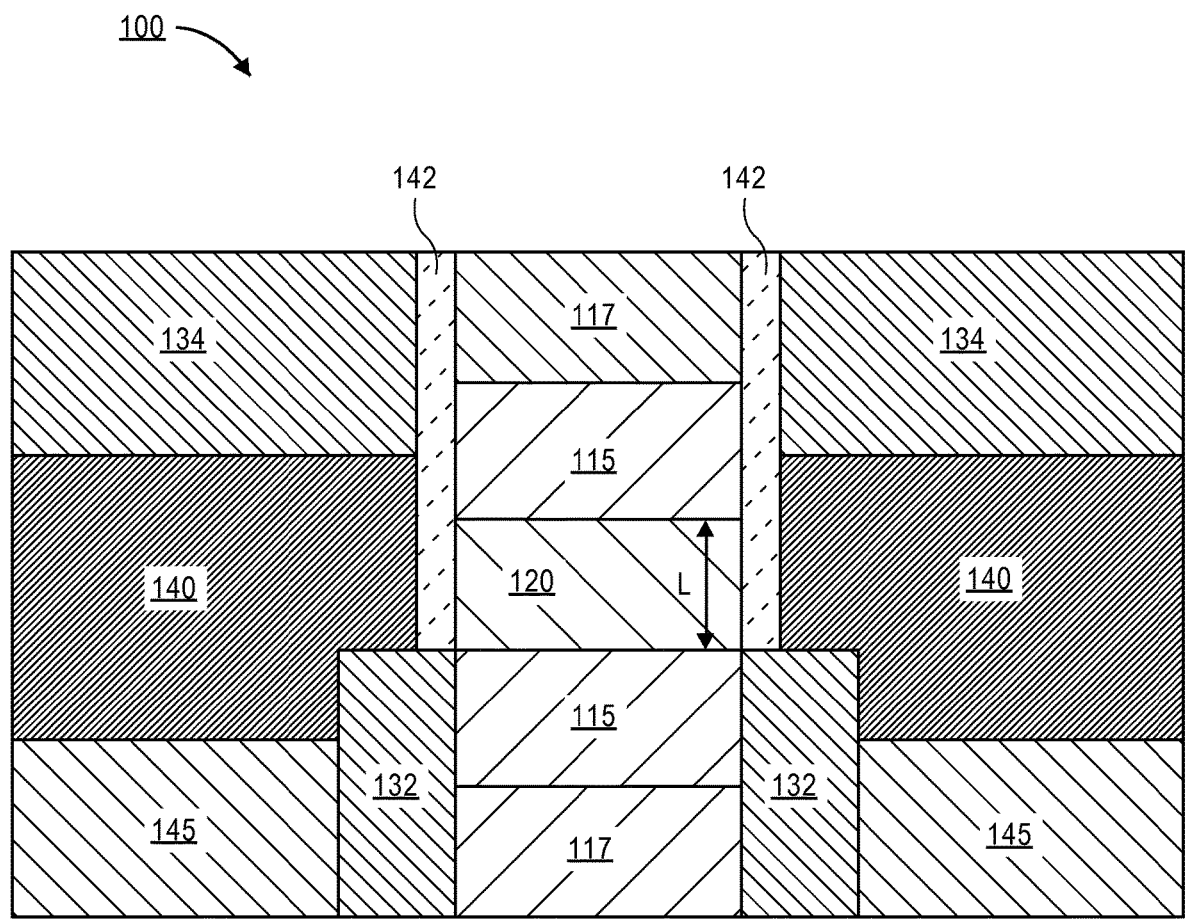
FIG. 1 is a cross-sectional illustration of a vertically oriented long channel transistor, according to an embodiment of the invention.

Referring now to FIG. 1, a cross-sectional illustration of a vertically oriented long channel MOS transistor 100 is shown, according to an embodiment of the invention. According to an embodiment, the channel 120 is formed between source/drain (S/D) regions 115. A first S/D region 115 may be formed above the top surface of the channel 120, and a second S/D may be formed below a bottom surface of the channel 120. S/D contacts 117 may be formed on the surfaces of the S/D regions 115 that are opposite from the channel 120. According to an embodiment, the sidewalls of the channel 120, the S/D regions 115, and the S/D contacts 117 may be substantially aligned with each other. The aligned configuration of these features is possible because they are formed from a vertical semiconductor fin, as will be described in greater detail below.

The channel length L may be varied depending on the desired electrical properties of the of the transistor 100. According to an embodiment, the channel length L may be approximately 5 nm or greater. In an additional embodiment, the channel length L may be greater than 30 nm. Additional embodiments allow for a channel length L that is substantially equal to the height of the fin on which the channel 120 is formed. For example, the channel length L may be approximately 150 nm. Since the S/D regions 115 and the channel 120 is stacked within a vertical fin, the long channel lengths L have an overhead footprint that is substantially similar to the overhead footprint of other non-planar transistor devices (e.g., tri-gate transistors) formed on the same chip.

Embodiments of the invention include a gate dielectric 142 that is formed along the sidewalls of the channel 120 in order to separate the channel 120 from the gate electrode 140. In the illustrated embodiment, the gate electrode 140 is formed adjacent to both sidewalls of the channel 120. As such, the transistor 100 may be referred to as dual-gate transistor. Additional embodiments may also include a gate dielectric 142 and a gate electrode 140 that completely encircle the channel 120 (i.e., the gate dielectric 142 and the gate electrode 140 wrap around the channel 120 into and out of the plane illustrated in FIG. 1). Such embodiments may be referred to as a gate-all-around (GAA) transistor, a nanowire transistor, or a nanoribbon transistor, depending on the geometry of the channel 120.

According to an embodiment, the gate dielectric 142 may also extend along sidewalls of the S/D regions 115 and the S/D contact region 117. In the illustrated embodiment, the gate dielectric 142 is only formed along the S/D region 115 and the S/D contact region 117 that are located above the channel 120. Accordingly, embodiments of the invention may also include dielectric spacers 132 that are formed along the sidewalls of the lower S/D region 115 and S/D contact region 117. The spacers 132 may separate the S/D contact region 117 and the S/D region 115 from the conductive vias 145 that provide an electrical connection to the gate electrode 140. Embodiments may also include second dielectric spacers 134 that are formed adjacent to the gate dielectric 142 proximate to the S/D region 115 and the S/D contact region 117 on the other end of the transistor 100 in order to electrically isolate surfaces of the gate electrode 140.

Typically, when fins are used to form tri-gate transistors, the bottom surface of the fin (i.e., the interface between the fin and the underlying substrate) is never exposed. As such, the ability to form S/D regions and S/D contacts along the bottom surfaces of the fins is not possible. Accordingly, electrical current cannot flow in the vertical dimension of the fin. In contrast, embodiments of the present invention allow for the bottom surface of the fin to be exposed. As such, S/D regions and S/D contacts along the bottom surfaces of fins may be formed, thereby allowing for the formation of a vertically oriented transistor. Furthermore, embodiments of the invention include processing operations for forming the vertically oriented transistor without the need for additional lithography operations when formed on the same chip as other short channel transistors, such as those used in CMOS devices.

Figure 2A:
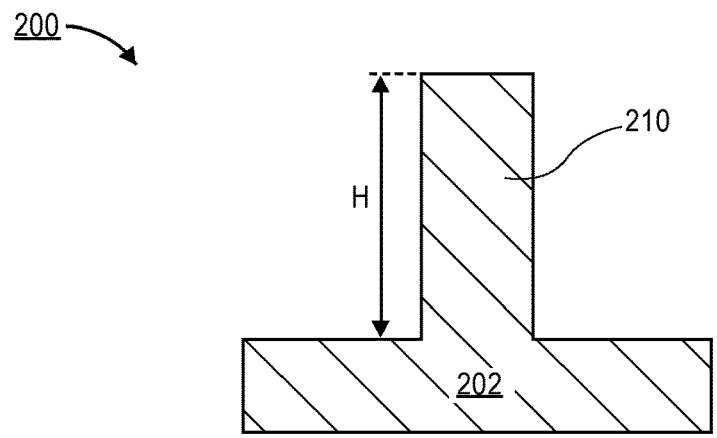
FIG. 2A is a cross-sectional illustration of a semiconductor fin formed on a semiconductor substrate, according to an embodiment of the invention.
Figure 2B:
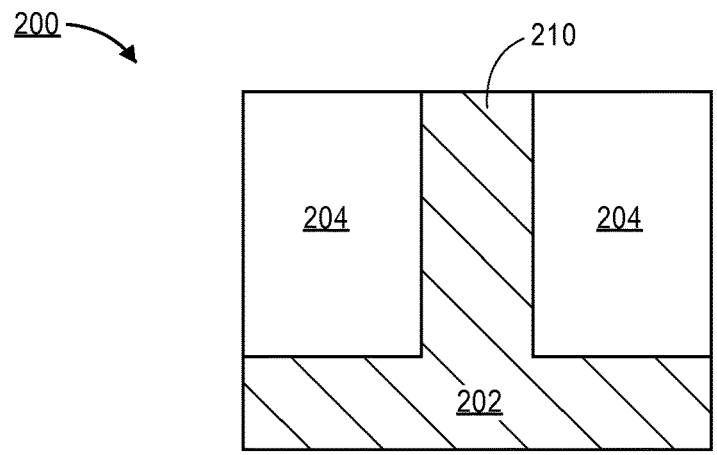
FIG. 2B is a cross-sectional illustration of FIG. 2A after a trench isolation oxide has been formed on the sidewalls of the fin, according to an embodiment of the invention.
Figure 2C:
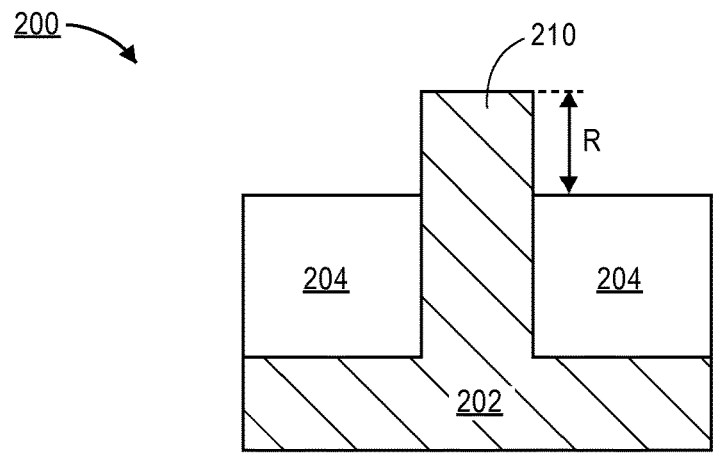
FIG. 2C is a cross-sectional illustration of FIG. 2B after the trench isolation oxide has been recessed, according to an embodiment of the invention.
Figure 2D:
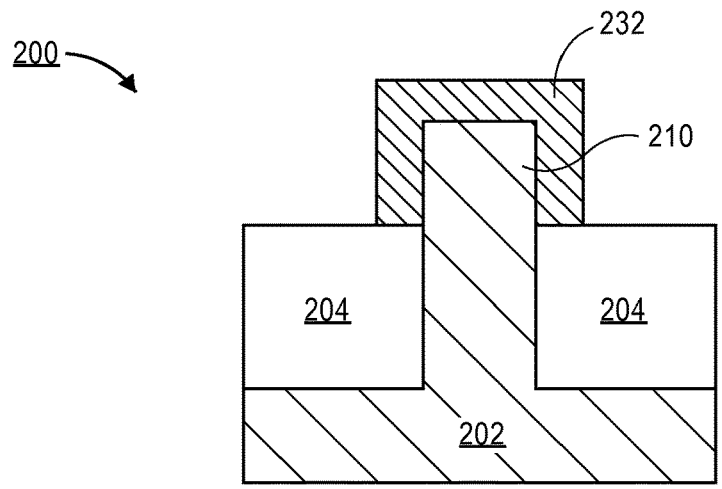
FIG. 2D is a cross-sectional illustration of FIG. 2C after a dielectric spacer is formed over a top portion of the fin, according to an embodiment of the invention.
Figure 2E:
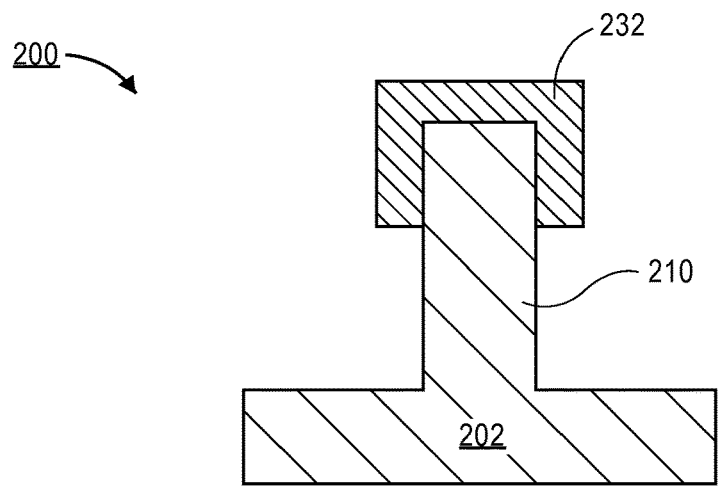
FIG. 2E is a cross-sectional illustration of FIG. 2D after the trench isolation oxide has been removed, according to an embodiment of the invention.
Figure 2F:
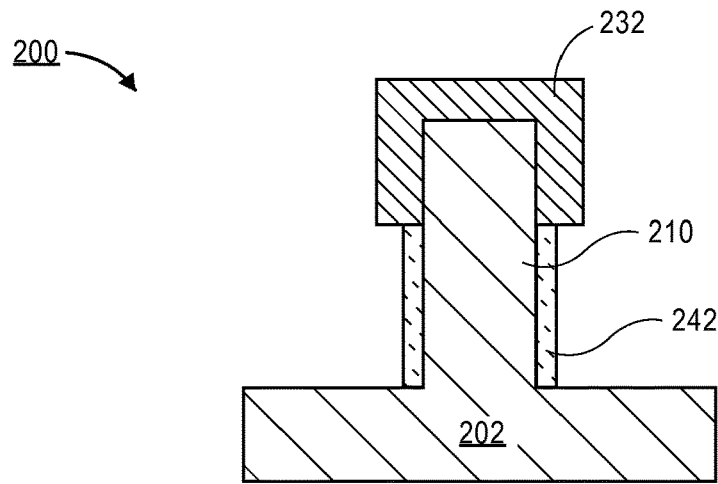
FIG. 2F is a cross-sectional illustration of FIG. 2E after a gate dielectric material is formed along the exposed sidewalls of the fin, according to an embodiment of the invention.
Figure 2G:
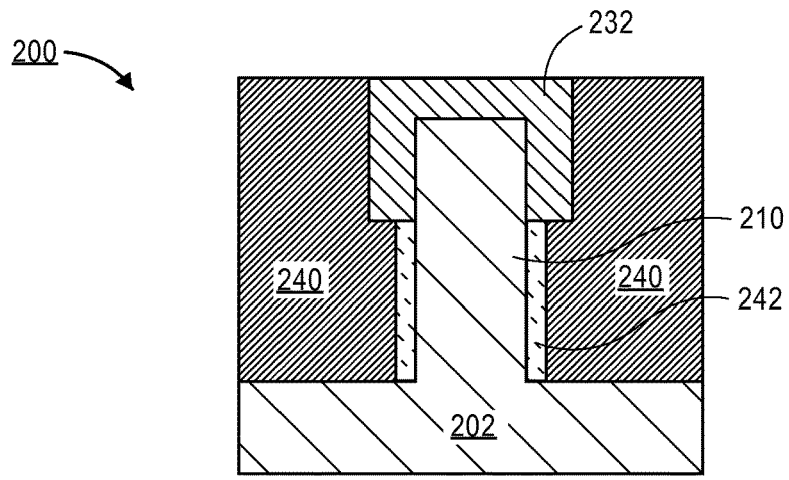
FIG. 2G is a cross-sectional illustration of FIG. 2F after a gate electrode material is deposited around the fin, according to an embodiment of the invention.
Figure 2H:
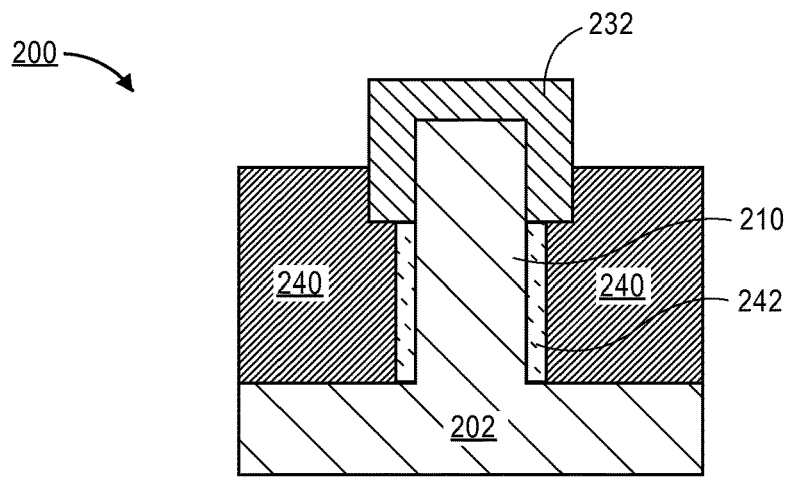
FIG. 2H is a cross-sectional illustration of FIG. 2G after the gate electrode material is recessed, according to an embodiment of the invention.
Figure 2I:
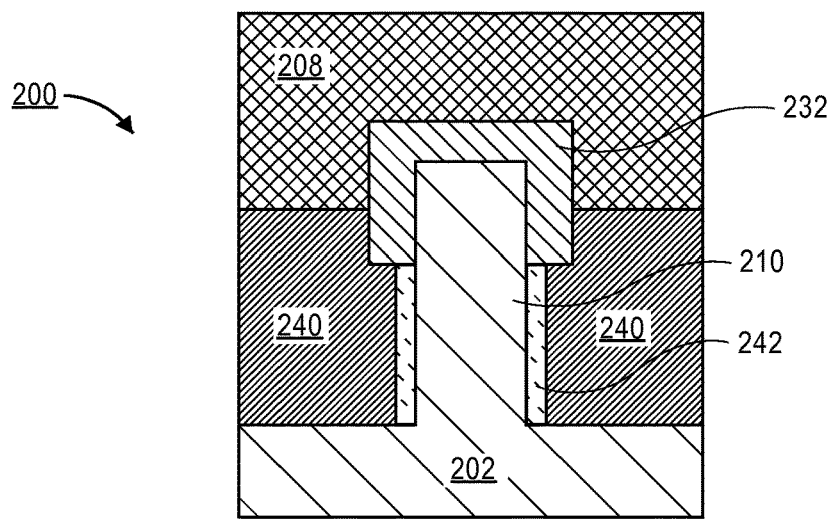
FIG. 2I is a cross-sectional illustration of FIG. 2H after an interlayer dielectric (ILD) is formed over the gate electrode and the dielectric spacer, according to an embodiment of the invention.
Figure 2J:
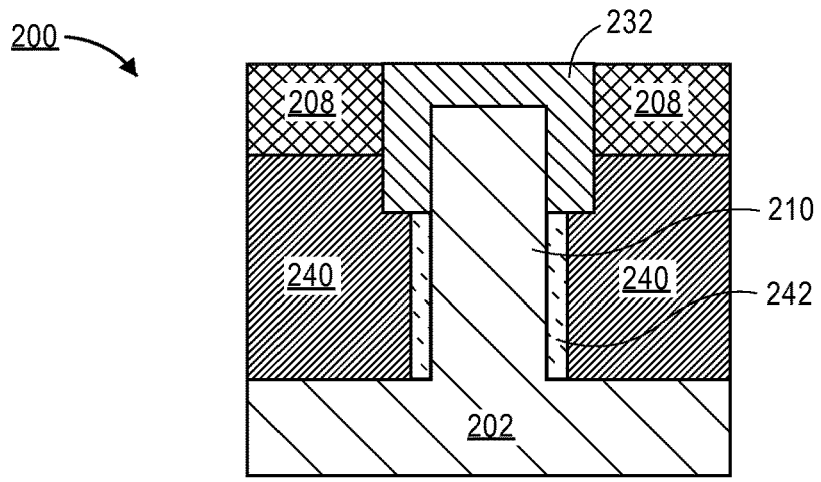
FIG. 2J is a cross-sectional illustration of FIG. 2I after the ILD is recessed to be substantially coplanar with a top surface of the dielectric spacer, according to an embodiment of the invention.
Figure 2K:
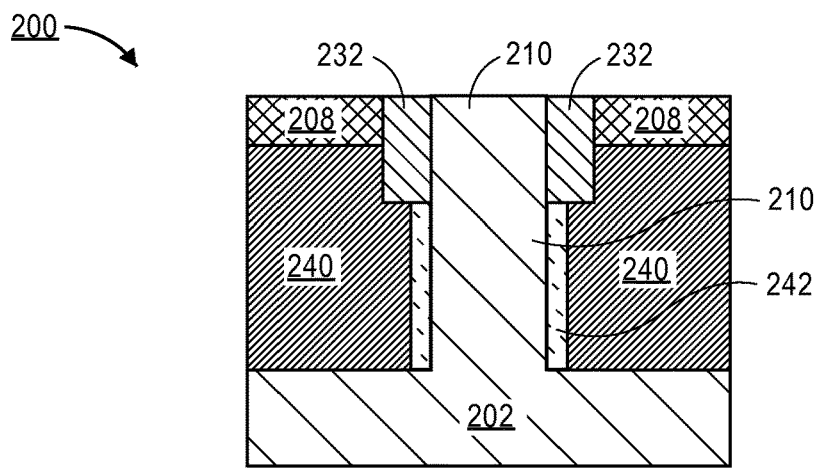
FIG. 2K is a cross-sectional illustration of FIG. 2J after the dielectric spacer and the ILD are etched back to expose a top surface of the fin, according to an embodiment of the invention.
Figure 2L:
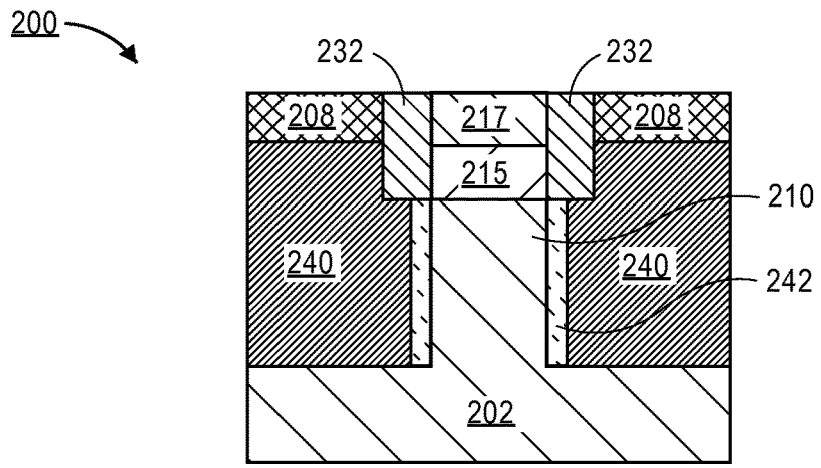
FIG. 2L is a cross-sectional illustration of FIG. 2K after a source/drain (S/D) region and a S/D contact region are formed in the top of the fin, according to an embodiment of the invention.
Figure 2M:
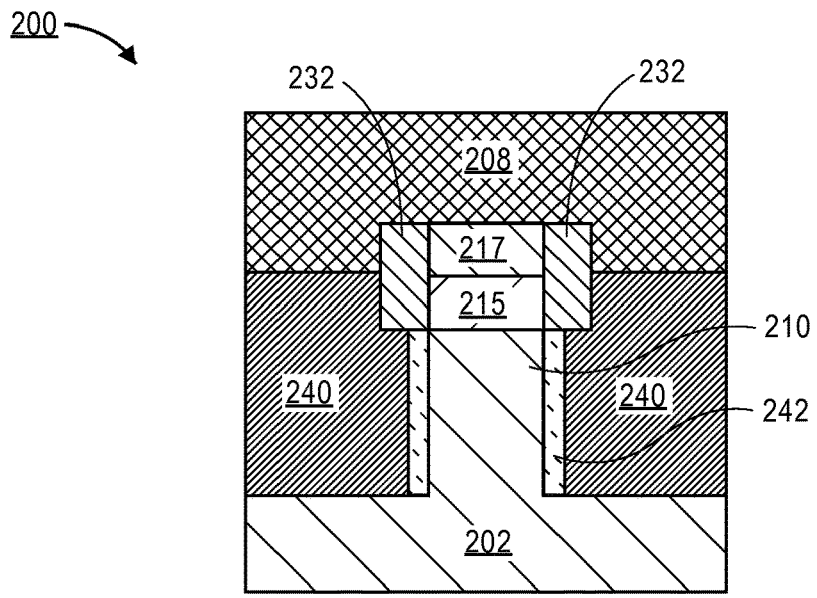
FIG. 2M is a cross-sectional illustration of FIG. 2L after a second ILD is grown over the exposed surfaces, according to an embodiment of the invention.
Figure 2N:
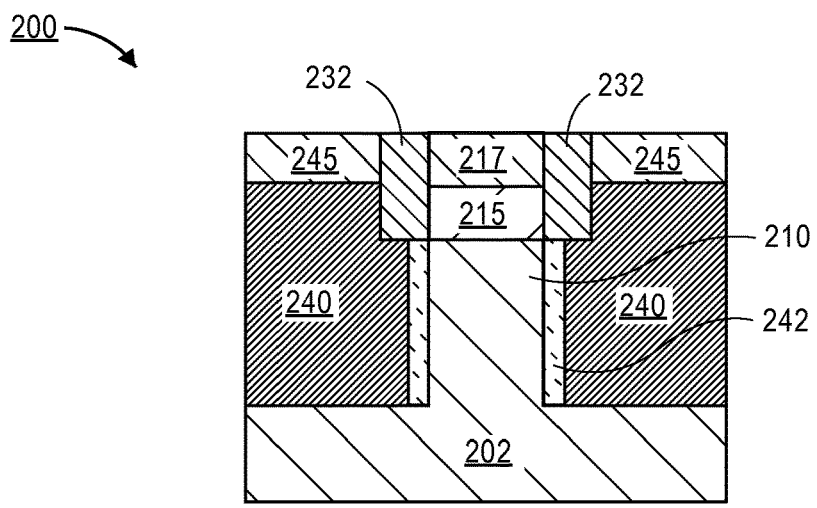
FIG. 2N is a cross-sectional illustration of FIG. 2M after the ILD is removed and gate contacts are formed over the exposed gate electrodes, according to an embodiment of the invention.
Figure 2O:
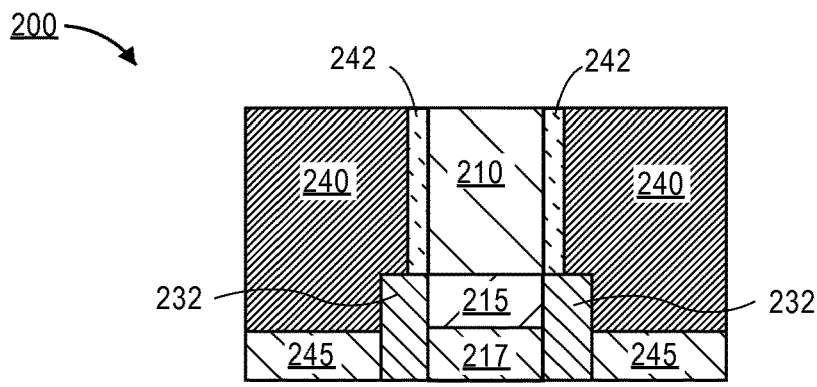
FIG. 2O is a cross-sectional illustration of FIG. 2N after the device is flipped over and the semiconductor substrate is etched back to reveal the bottom portion of the fin, according to an embodiment of the invention.
Figure 2P:
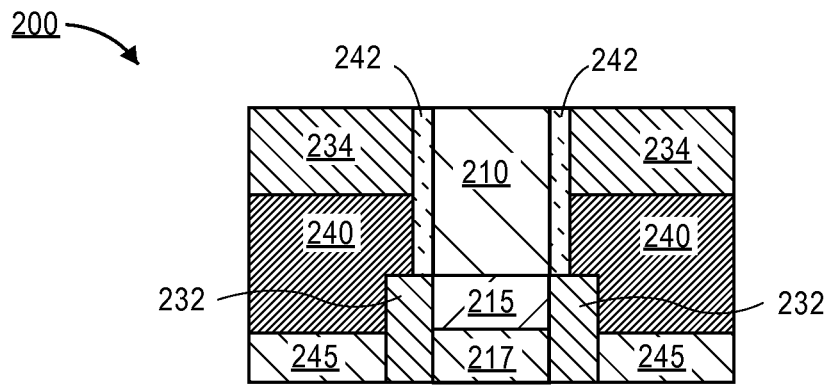
FIG. 2P is a cross-sectional illustration of FIG. 2O after the exposed portions of the gate electrode are recessed and a second spacer material is formed over the gate electrodes, according to an embodiment of the invention.
Figure 2Q:
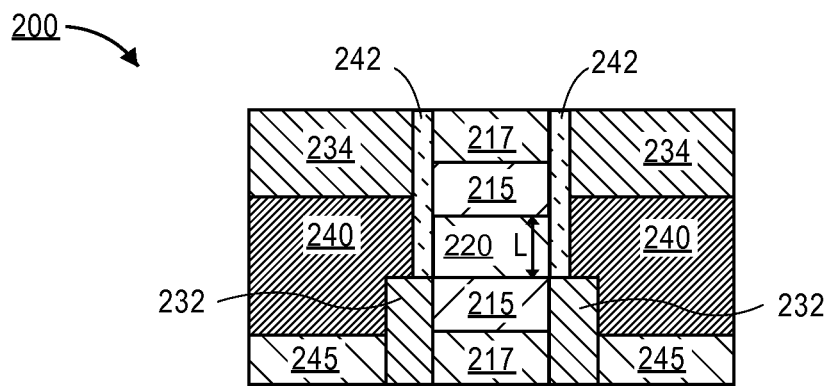
FIG. 2Q is a cross-sectional illustration of FIG. 2P after a S/D region and a S/D contact region are formed in the fin, according to an embodiment of the invention.

Referring now to FIGS. 2A-2Q, a process for forming a vertically oriented long channel transistor 200 is illustrated according to an embodiment of the invention. Starting with FIG. 2A, a semiconductor substrate 202 is patterned to form one or more fins 210. While a single fin 210 is illustrated in FIG. 2A, it is to be appreciated that a plurality of fins 210 may be formed over the substrate 202. In an embodiment, some fins 210 may be used to form vertically oriented long channel transistors 200 while additional fins may be used to form short channel transistors. According to an embodiment, the semiconductor substrate 202 may be a crystalline substrate formed using a bulk silicon or a silicon-on-insulator substructure. In other embodiments, the semiconductor substrate 202 may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

The fins 210 may be formed with any desired dimensions suitable for the formation of the vertically oriented long channel transistors 200 and short channel transistors. According to embodiments of the invention, the fins 210 may be high aspect ratio fins, such as fins with a height to width ratio of 10:1 or greater. According to embodiments of the invention, the fins 210 may have a height between approximately 20 nm and 150 nm and have widths between approximately 5 nm and 30 nm. Embodiments may also include forming the plurality of fins with a pitch that is approximately 40 nm or greater. The fins 210 may be formed with any well-known technique such as masking and etching. Embodiments of the invention include forming the fins 210 with a wet or dry etching process that is well-known in the art.

Referring now to FIG. 2B, a trench isolation oxide 204 may be deposited along the sidewalls of the fin 210. In an embodiment, the trench isolation oxide 204 may fill the trenches between each of the fins 210 when a plurality of fins 210 are formed. According to an embodiment, the trench isolation oxide 204 may be any oxide, such as a silicon dioxide. In some embodiments, a chemical-mechanical polishing process may be used to planarized a top surface of the trench isolation oxide 204 with a top surface of the fin 210.

Referring now to FIG. 2C, embodiments of the invention include recessing the top surface of the trench isolation oxide 204. The recessing operation of the trench isolation oxide may be implemented concurrently with the recessing operation used in the production of CMOS transistors at other locations on the semiconductor substrate 202. According to an embodiment the trench isolation oxide 204 may be recessed with any suitable etching process. The trench isolation oxide 204 may be recessed a distance R. In an embodiment, the distance R may be the same recessing amount needed for the CMOS region of the semiconductor substrate 202. Alternatively, the recess distance R may be a different distance than the amount needed for the CMOS region. The distance R may be tightly controlled to form a desired gate length in the finished vertically oriented transistors. In some embodiments, the distance R may be different proximate to different fins 210. Varying the distance R between fins 210 allows for the formation of vertically oriented transistors that have different gate lengths, thereby allowing greater flexibility in the design of the electrical properties of the finished device.

After the recessing operation, a blanket sacrificial gate oxide and polysilicon deposition and patterning operation may be implemented in order to form a sacrificial gate material in the CMOS regions of the semiconductor substrate 202. The blanket polysilicon deposition and patterning operations are not illustrated in this process flow because the patterning operation used to form the sacrificial gate material in the CMOS region may also be used to completely remove the polysilicon from the regions of the semiconductor substrate where vertically oriented transistors are being formed. Accordingly, after the formation of the sacrificial gate in the CMOS regions, the vertically oriented transistor regions will appear substantially similar to the device illustrated in FIG. 2C.

Referring now to FIG. 2D, a dielectric spacer 232 is formed over the exposed portion of the fin 210. In an embodiment, the dielectric spacer 232 is formed with a blanket deposition of the dielectric material, followed by a spacer etching process. The formation of the dielectric spacer 232 may be done with the same processing operations used in the CMOS regions to form spacers alongside the polysilicon replacement gate. Embodiments of the invention may use any suitable dielectric material that may be etched selectively to the trench isolation oxide 204. For example, the dielectric spacer 232 may be a material such as silicon nitride, silicon oxide, silicon carbide, silicon nitride doped with carbon, or silicon oxynitride. Processes for forming sidewall spacers are well known in the art and generally include deposition and etching processes.

At this stage, the processing of the vertically oriented transistor may continue along in different process flows, depending on whether the formation of the CMOS transistors follow a gate first process flow or a gate last process flow. Additionally, if there are no CMOS transistors being formed, then either process flow may be used to form substantially similar devices.

Referring now to FIG. 2E, the process flow continues along with the processing operations that may be used when a gate first process is used to form the CMOS transistors. According to an embodiment illustrated in FIG. 2E, the trench isolation oxide 204 is removed. For example, the trench isolation oxide 204 may be selectively removed with a wet or anisotropic dry etch. Since the dielectric spacer 232 is etch selective to the trench isolation oxide 204, the removal of the trench isolation oxide 204 will not significantly degrade the shape of the spacer 232. The removal of the trench isolation oxide 204 exposes lower sidewalls of the fin 210. The height of the exposed sidewalls is dependent on the distance of the recess R in the processing operation described above in FIG. 2C. Accordingly, the exposed height of the fins 210 may be approximately the height H of the fin 210 minus the recessing distance R.

Referring now to FIG. 2F, embodiments of the invention may include depositing a gate dielectric material 242 along the exposed sidewalls of the fin 210. According to an embodiment, the gate dielectric 242 may include one layer or a stack of layers. The one or more layers may include silicon oxide, silicon dioxide ($SiO_2$), and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. The deposition of the gate dielectric material 242 may be implemented at the same time the gate dielectric material is deposited in the CMOS region of the semiconductor substrate 202.

Referring now to FIG. 2G, embodiments of the invention include depositing a gate electrode 240 into the trenches next to the fin 210. After the gate electrode 240 is deposited, the top surface may be polished so that the top surface of the gate electrode 240 and the top surface of the dielectric spacer 232 are substantially coplanar with each other. In an embodiment, the gate electrode 240 is formed in contact with the gate dielectric 242 and may consist of at least one P-type workfunction metal or N-type workfunction metal, depending on whether the transistor is to be a PMOS or an NMOS transistor. In some embodiments, the gate electrode 240 may consist of two or more metal layers, where one or more metal layers are workfunction metal layers and at least one metal layer is a fill metal layer. For a PMOS transistor, metals that may be used for the gate electrode 240 include, but are not limited to, ruthenium, palladium, platinum, cobalt, nickel, and conductive metal oxides, e.g., ruthenium oxide. A P-type metal layer will enable the formation of a PMOS gate electrode 240 with a workfunction that is between approximately 4.9 eV and about 5.2 eV. For an NMOS transistor, metals that may be used for the gate electrode 240 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. While embodiments above describe metals that may be used to form N-type or P-type devices, additional embodiments may also include midgap devices. In such embodiments, any metal may be used to provide a workfunction that is any desired value. For example, the metal used may allow for a workfunction between approximately 3.9 eV and approximately 5.2 eV.

Referring now to FIG. 2H, embodiments of the invention may include recessing the gate electrode 240 so that the top surface is below the top surface of the dielectric spacer 232. The gate electrode 240 may be recessed with any suitable etching process, such as a wet or dry etching process.

Referring now to FIG. 2I, embodiments of the invention include depositing an interlayer dielectric (ILD) material 208 over the top surface of the gate electrode 240 and over the dielectric spacer 232. The ILD 208 may be formed using dielectric materials known for their applicability in integrated circuit structures, such as low-k dielectric materials. For example, the ILD 208 may be silicon dioxide (SiO$_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD 208 may include pores or air gaps to further reduce their dielectric constant. According to an embodiment the ILD 208 is deposited at the same time that the ILD material is deposited over the structures in the CMOS regions of the semiconductor substrate.

Referring now to FIG. 2J, embodiments of the invention include recessing the ILD 208 so that a top surface is substantially coplanar with a top surface of the dielectric spacer 232. For example, the ILD 208 may be etched with a dry-etching process. In an embodiment, once the top surface of the dielectric spacer 232 is exposed, a second etching process may be implemented that etches both the ILD 208 and the dielectric spacer 232 until a top surface of the pillar 210 is exposed, as illustrated in FIG. 2K. According to an embodiment, the etching of the ILD 208 may be implemented in the areas that have vertically oriented transistors and the regions of the semiconductor substrate 202 that include CMOS devices may not have the ILD etched back.

Referring now to FIG. 2L, embodiments of the invention include forming a first S/D region 215 and a first S/D contact region 217 in the upper portion of the fin 210. In one embodiment the S/D region 215 is formed using either an implantation/diffusion process or an etching/deposition process. In the former process, dopants such as boron, aluminum, antimony, phosphorous, or arsenic may be ion-implanted into the substrate to form the S/D region 215. An annealing process that activates the dopants and causes them to diffuse further into the substrate may also follow the ion implantation process, according to some embodiments. In the latter process, the fin 210 may first be etched to form recesses between the dielectric spacers 232. An epitaxial deposition process may then be carried out to fill the recesses with material that is used to fabricate the S/D region 215. In some embodiments, the S/D region 215 may be fabricated using a silicon alloy such as silicon germanium or silicon carbide. In some implementations the epitaxially deposited silicon alloy may be doped in situ with dopants such as boron, arsenic, or phosphorous. In further embodiments, the S/D region 215 may be formed using one or more alternate semiconductor materials such as germanium or a group III-V material or alloy. And in further embodiments, one or more layers of metal and/or metal alloys may be used to form the S/D regions 215.

According to an embodiment, the S/D contact region 217 may be any suitable conductive material. In one embodiment the conductive material is a metallic material, such as tungsten. Additional embodiments may include an S/D contact region 217 that includes bilayers. For example, the bilayer may include a contact metal with a conductive via material formed over the contact metal. Examples of contact metals may include titanium, platinum, NiSi, Ni, aluminum, and gold, silicides, and self-aligned silicides (which may also be referred to as salicides by those skilled in the art). The S/D contact region 217 may be formed by recessing the S/D region 215 and then depositing the conductive material. In an additional embodiment, when the S/D region 215 is formed with an epitaxial growth process, the initial etching process used to form the opening for the S/D region 215 may be made deep enough into the fin 210 for both the S/D region 215 and the S/D contact region 217 may be formed in the opening.

Referring now to FIG. 2M, embodiments of the invention may also include depositing an ILD 208 over the exposed top surfaces of the dielectric spacers 232 and the S/D contact region 217. For example, the ILD 208 may be the same low-k dielectric material used to deposit the first ILD layer. According to an embodiment the deposition of the ILD 208 may be followed with a polishing operation that polishes the newly deposited ILD 208 so that the top surface is substantially planar with the ILD that was previously deposited in other regions of the silicon substrate 202, such as the CMOS regions.

Referring now to FIG. 2N, embodiments of the invention include etching back the ILD 208 in the regions of the semiconductor substrate 202 where vertically oriented transistors 200 are desired. After the ILD 208 is etched back, the top surfaces of the gate electrode 240 are exposed. According to an embodiment, gate contacts 245 may be formed over the exposed gate electrodes 240. In some embodiments, the gate contacts 245 are not formed along the entire top surface of the gate electrode 240 (i.e., the gate contacts 245 may not extend along the entire surface of the gate electrode 240 into and out of the plane illustrated in FIG. 2N). In such embodiments, the gate contacts 245 may be referred to as gate vias.

After the formation of the gate contacts 245, embodiments of the invention may proceed with forming any additional back-end of line (BEOL) metal interconnects that may be needed. The additional BEOL interconnects are omitted from the figures in order to not unnecessarily obscure the illustrated embodiment. However, those skilled in the art will appreciate that one or more alternating layers of ILD material and interconnect lines may be electrically coupled to the S/D contact region 117 and the gate contact 245 by one or more vias formed through the ILD layers.

Referring now to FIG. 2O, embodiments of the invention include flipping the device 200 over, so that the portion of the fin 210 that was previously considered the bottom of the fin 210 is now oriented at the top of the structure. In the illustrated embodiment, the semiconductor substrate 202 has been etched back to reveal a surface of the fin 210, a portion of the gate dielectric 242, and the gate electrodes 240.

Referring now to FIG. 2P, embodiments of the invention may include recessing the gate electrodes 240. According to an embodiment, the recessed regions of the gate electrodes 240 may then be filled with a spacer material 234. In an embodiment, the spacer material 234 may be any suitable spacer material 234 that is etch selective to the material that the fin 210 is formed from. In an embodiment the spacers 234 may be the same material used to form the dielectric spacers 232. For example, the spacers 234 may be a material such as silicon nitride, silicon oxide, silicon carbide, silicon nitride doped with carbon, or silicon oxynitride.

Referring now to FIG. 2Q, embodiments of the invention include the formation of S/D regions 215 and the S/D contact regions 217 on the other side of the device. In one embodiment the S/D region 215 is formed using either an implantation/diffusion process or an etching/deposition process. In the former process, dopants such as boron, aluminum, antimony, phosphorous, or arsenic may be ion-implanted into the substrate to form the S/D region 215. An annealing process that activates the dopants and causes them to diffuse further into the substrate may also follow the ion implantation process, according to some embodiments. In the latter process, the fin 210 may first be etched to form recesses between the dielectric spacers 232. An epitaxial deposition process may then be carried out to fill the recesses with material that is used to fabricate the S/D region 215. In some embodiments, the S/D region 215 may be fabricated using a silicon alloy such as silicon germanium or silicon carbide. In some implementations the epitaxially deposited silicon alloy may be doped in situ with dopants such as boron, arsenic, or phosphorous. In further embodiments, the S/D region 215 may be formed using one or more alternate semiconductor materials such as germanium or a group III-V material or alloy. And in further embodiments, one or more layers of metal and/or metal alloys may be used to form the S/D region 215.

According to an embodiment, the S/D contact region 217 may be any suitable conductive material. In one embodiment the conductive material is a metallic material, such as tungsten. The S/D contact region 217 may be formed by recessing the S/D region 215 and then depositing the conductive material. In an additional embodiment, when the S/D region 215 is formed with an epitaxial growth process, the initial etching process used to form the opening for the S/D region 215 may be made deep enough into the fin 210 for both the S/D region 215 and the S/D contact region 217 may be formed in the opening.

According to an additional embodiment, after the fin 210 is exposed when the substrate 202 is etched back, the remaining portions of the fin 210 may be etched away. In such an embodiment, an epitaxial layer may be grown to form the channel 220. As such, embodiments of the invention may also allow for the channel 220 in the vertically oriented transistors 200 to be a different semiconductive material than the CMOS transistors in other regions of the device.

According to an embodiment, the formation of the S/D region 215 in FIG. 2Q defines the channel 220. As illustrated, the channel length L may be defined by the distance between the two S/D regions 215. Furthermore, it is to be appreciated that the lower S/D region 215, channel 220, and upper S/D region 215 are self-aligned with each other. The self-alignment allows for the sidewalls of each of these features to be substantially coplanar to each other. According to an embodiment, the S/D contacts 217 may also be self-aligned with the stack and include coplanar sidewalls as well. The self-aligned features are possible because they are all fabricated from the fin 210 that was originally formed on the semiconductor substrate 202. For example, the S/D regions 215 may be formed by doping the fin 210, and/or by epitaxially growing the S/D regions 215 over the fin 210 using the dielectric spacers 232 or the gate dielectric/spacers 242/234 as a self-aligned mask to confine the growth of the epitaxial layers.

As discussed above, the processing flow may be varied depending on whether the CMOS devices are produced with a gate first or a gate last flow. Referring now to FIGS. 3A-3G, embodiments of the invention illustrate the process flow for forming vertically oriented transistors when the CMOS devices are formed with a gate last process flow.

Figure 3A:
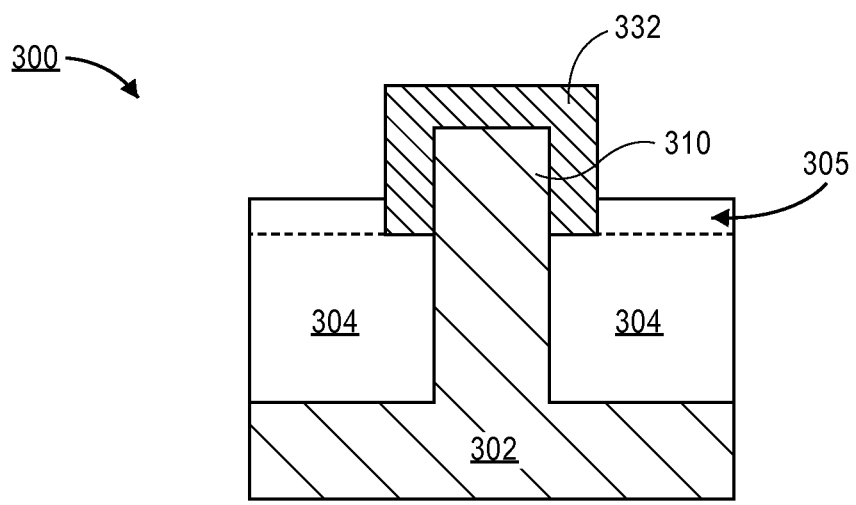
FIG. 3A is a cross-sectional illustration of FIG. 2D after a second portion of trench isolation material is formed that extends up a sidewall of the dielectric spacer, according to an embodiment of the invention.

Referring now to FIG. 3A, embodiments of the invention include a device that is substantially similar to the device described above with respect to FIG. 2D. Accordingly the processing operations used to form the device illustrated in FIG. 3A will not be described in detail. However, it is to be appreciated that device 300 does include an additional portion of trench isolation material 305 formed above the layer 304. According to an embodiment, an additional portion of the trench isolation material 305 may be formed after the dielectric spacer 332 is formed over the top portion of the fin 310. The fin 310 may extend up from a semiconductor substrate 302. Accordingly, the trench isolation material 305 may extend up a sidewall of the surface of the dielectric spacer 332, according to some embodiments of the invention. Depositing an extra portion of trench isolation material 305 above the layer 304 may allow for a decrease in the etch selectivity needed between the dielectric spacer 332 and the trench isolation material 304/305. For example, in subsequent etching processes to expose a top surface of the fin 310, the etching may remove portions of both the dielectric spacer 332 and the trench isolation material 305. For simplicity, and since trench isolation material 304 and 305 may be the same material, the remaining Figures will be depicted as the two layers being a single layer 304.

Figure 3B:
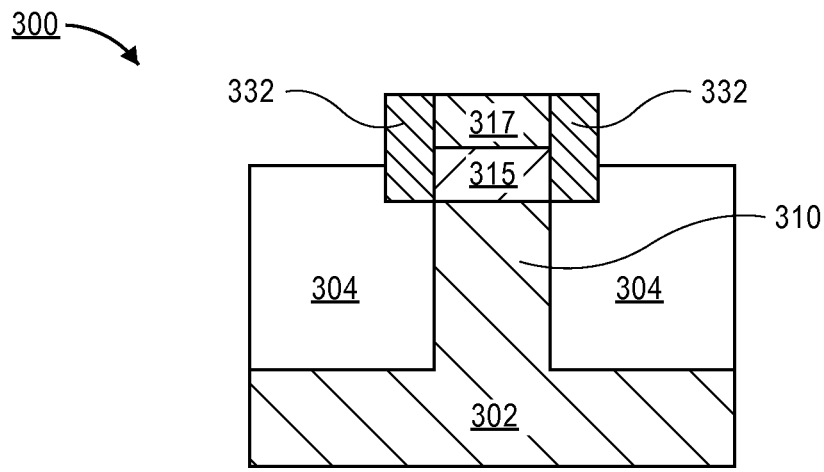
FIG. 3B is a cross-sectional illustration of FIG. 3A after a S/D region and a S/D contact region are formed in the top of the fin, according to an embodiment of the invention.

Referring now to FIG. 3B, embodiments of the invention include exposing a top surface of the fin 310 by etching back the spacer 332. After the top surface of the fin 310 is exposed, embodiments may include forming the S/D regions 315 and the S/D contact regions 317 in the exposed fin 310. In one embodiment the S/D region 315 is formed using either an implantation/diffusion process or an etching/deposition process. The processing used to form the S/D region 315 may be substantially similar to the processing operations used to form the S/D regions 215 described above, and as such will not be described in detail here. According to an embodiment, the S/D contact region 317 may be any suitable conductive material. In one embodiment the conductive material is a metallic material, such as tungsten. The processing used to form the S/D contact region 317 may be substantially similar to the processing used to form the S/D contact region 217 described above, and as such will not be described in detail here.

Figure 3C:
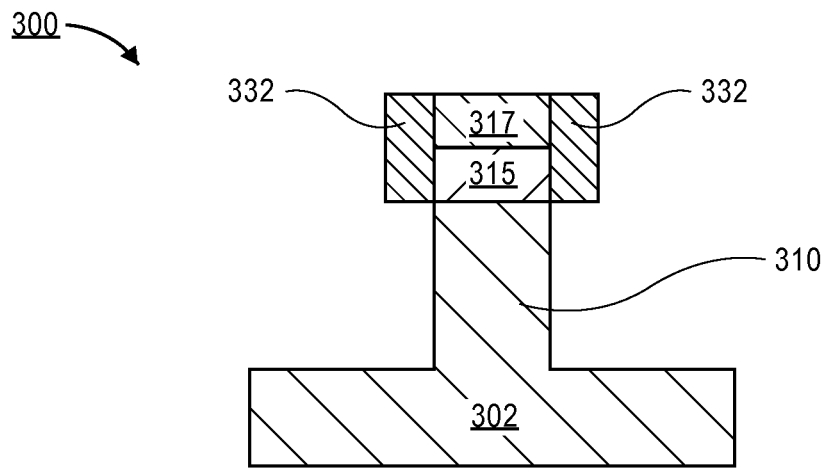
FIG. 3C is a cross-sectional illustration of FIG. 3B after the trench isolation oxide is removed, according to an embodiment of the invention.

Referring now to FIG. 3C, embodiments of the invention may include removing the trench isolation oxide 304. For example, the trench isolation oxide 304 may be selectively removed with a wet or anisotropic dry etch. Since the dielectric spacer 332 is etch selective to the trench isolation oxide 304, the removal of the trench isolation oxide 304 will not significantly degrade the shape of the spacer 332. The removal of the trench isolation oxide 304 exposes lower sidewalls of the fin 310. The height of the exposed sidewalls is dependent on the distance of the recess R in the processing operation described above in FIG. 2C. Accordingly, the exposed height of the fins 310 may be approximately the height H of the fin 310 minus the recessing distance R.

Figure 3D:
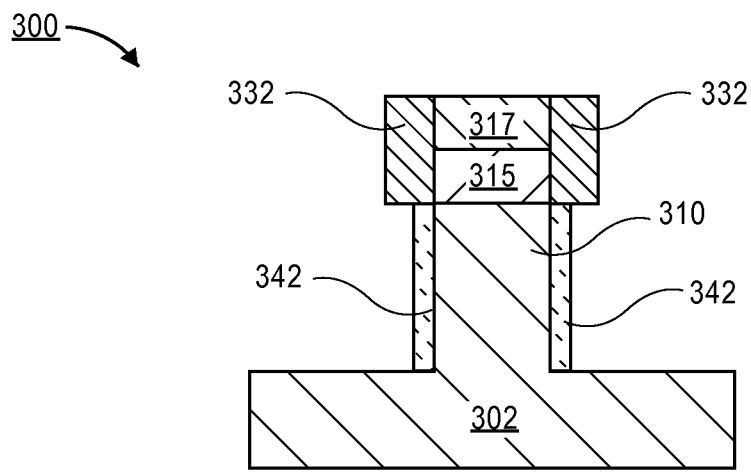
FIG. 3D is a cross-sectional illustration of FIG. 3C after a gate dielectric material is formed along the exposed sidewalls of the fin, according to an embodiment of the invention.

Referring now to FIG. 3D, embodiments of the invention may include depositing a gate dielectric material 342 along the exposed sidewalls of the fin 310. According to an embodiment, the gate dielectric layer may include one layer or a stack of layers. The one or more layers may include silicon oxide, silicon dioxide ($SiO_2$) and/or a high-k dielectric material, such as those listed above for gate dielectric 242.

Figure 3E:
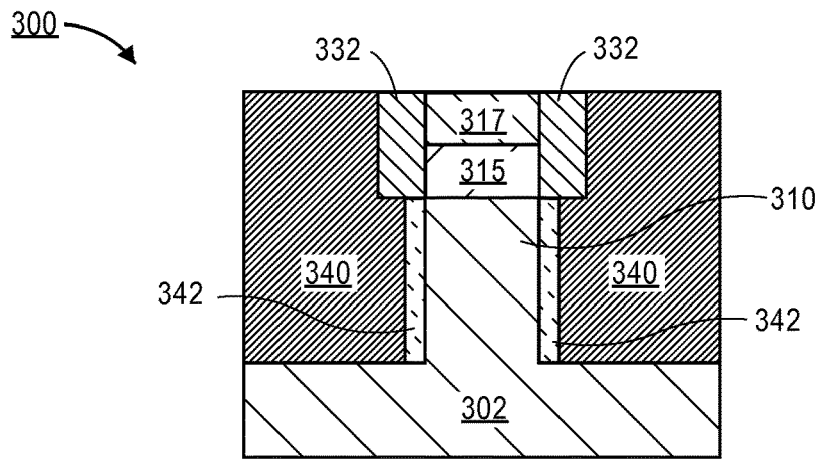
FIG. 3E is a cross-sectional illustration of FIG. 3D after a gate electrode material is deposited around the fin, according to an embodiment of the invention.

Referring now to FIG. 3E, embodiments of the invention include depositing a gate electrode 340 into the trenches next to the fin 310. After the gate electrode 340 is deposited, the top surface may be polished so that the top surface of the gate electrode 340 and the top surface of the dielectric spacers 332 are substantially coplanar with each other. In an embodiment, the gate electrode 340 is formed in contact with the gate dielectric 342 and may consist of at least one P-type workfunction metal or N-type workfunction metal, depending on whether the transistor is to be a PMOS or an NMOS transistor. Examples of materials that may be used to form PMOS and NMOS transistors that may be used according to embodiments of the invention are described above, and therefore, will not be repeated here.

Figure 3F:
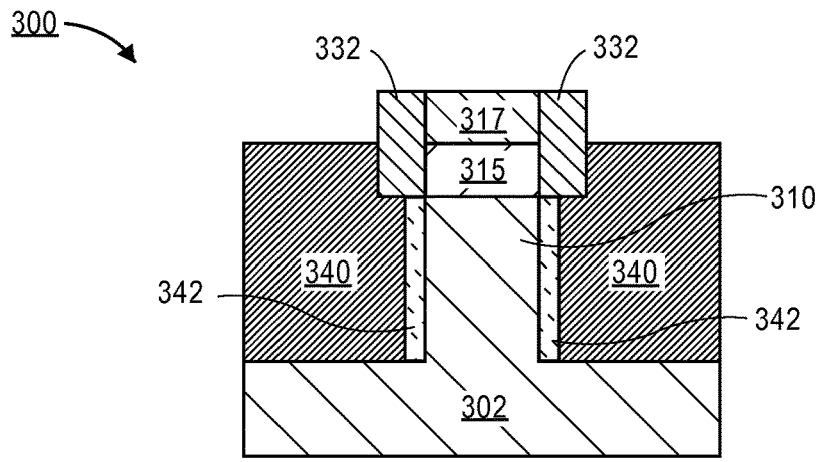
FIG. 3F is a cross-sectional illustration of FIG. 3E after the gate electrode material is recessed, according to an embodiment of the invention.

Referring now to FIG. 3F, embodiments of the invention may include recessing the gate electrode 340 so that the top surface is below the top surface of the dielectric spacers 332. The gate electrode 340 may be recessed with any suitable etching process, such as a wet or dry etching process.

Figure 3G:
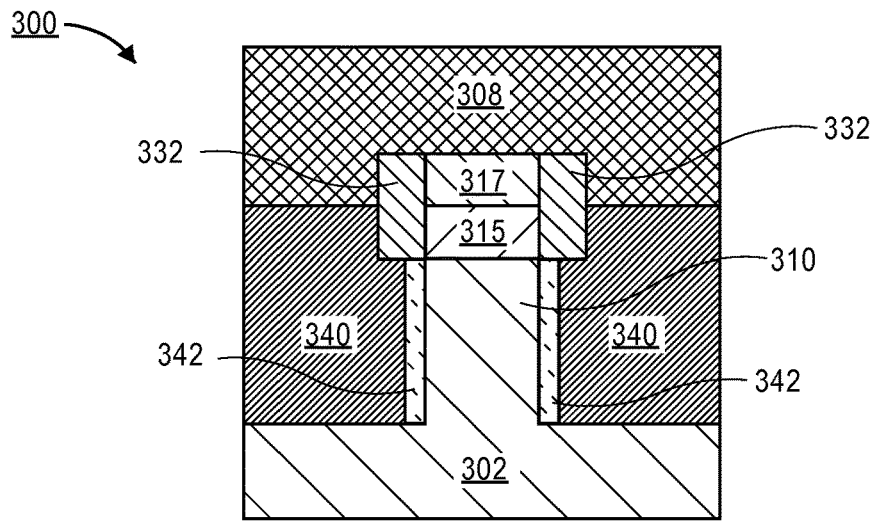
FIG. 3G is a cross-sectional illustration of FIG. 3F after an ILD is grown over the exposed surfaces, according to an embodiment of the invention.

Referring now to FIG. 3G, embodiments of the invention include depositing an ILD material 308 over the top surface of the gate electrode 340 and over the dielectric spacer 332. The ILD 308 may be formed using dielectric materials known for their applicability in integrated circuit structures, such as low-k dielectric materials. Examples of low-k dielectric materials that may be used according to embodiments of the invention are described above, and therefore will not be repeated here.

After the ILD 308 is formed in FIG. 3G, the vertically oriented transistor device is substantially similar to the device illustrated in FIG. 2M described above. Accordingly, the processing operations needed to finish the formation of the vertically oriented transistor device may continue with a substantially similar process to the process described above with respect to FIGS. 2N-2Q, and therefore will not be repeated here.

Figure 4:
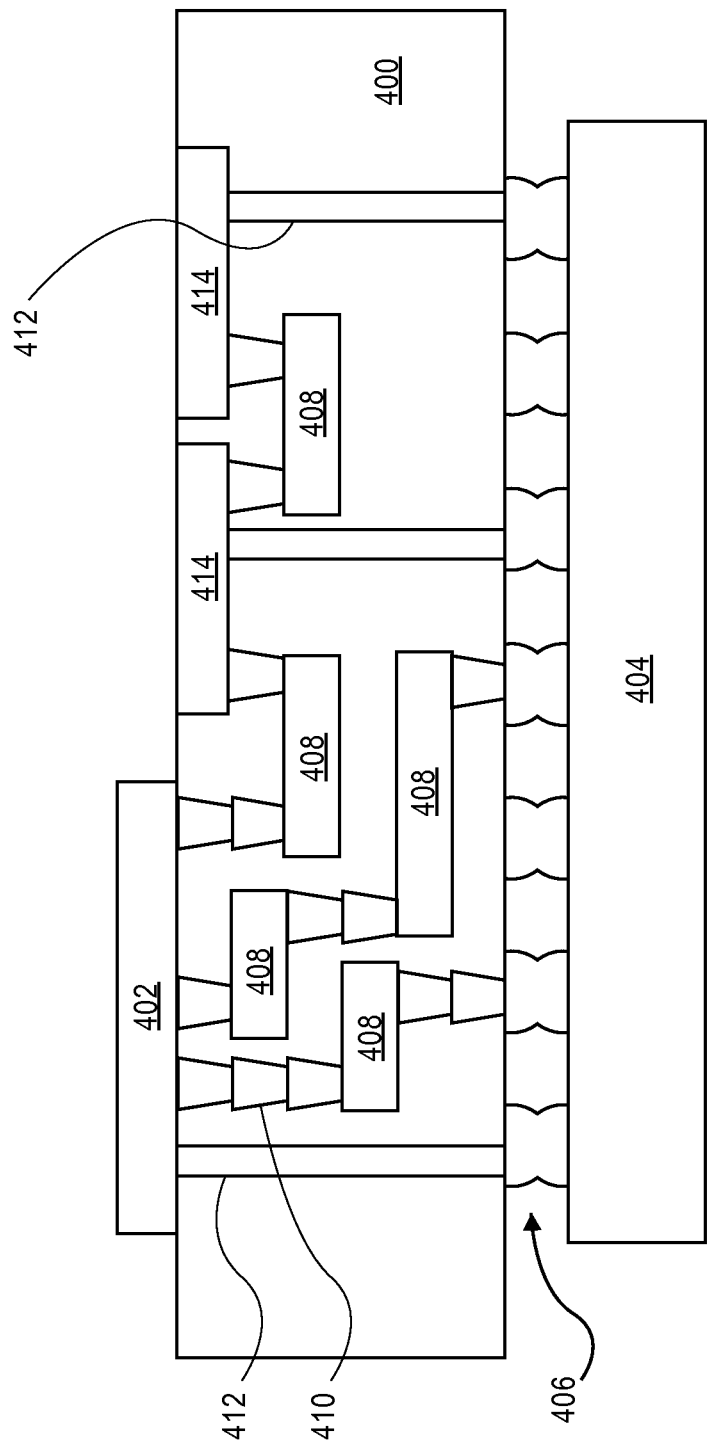
FIG. 4 is a cross-sectional illustration of an interposer implementing one or more embodiments of the invention.

FIG. 4 illustrates an interposer 400 that includes one or more embodiments of the invention. The interposer 400 is an intervening substrate used to bridge a first substrate 402 to a second substrate 404. The first substrate 402 may be, for instance, an integrated circuit die. The second substrate 404 may be, for instance, a memory module, a computer motherboard, or another integrated circuit die. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400.

In accordance with embodiments of the invention, apparatuses that include vertically oriented long channel transistors or processes for forming such transistors disclosed herein may be used in the fabrication of interposer 400.

Figure 5:
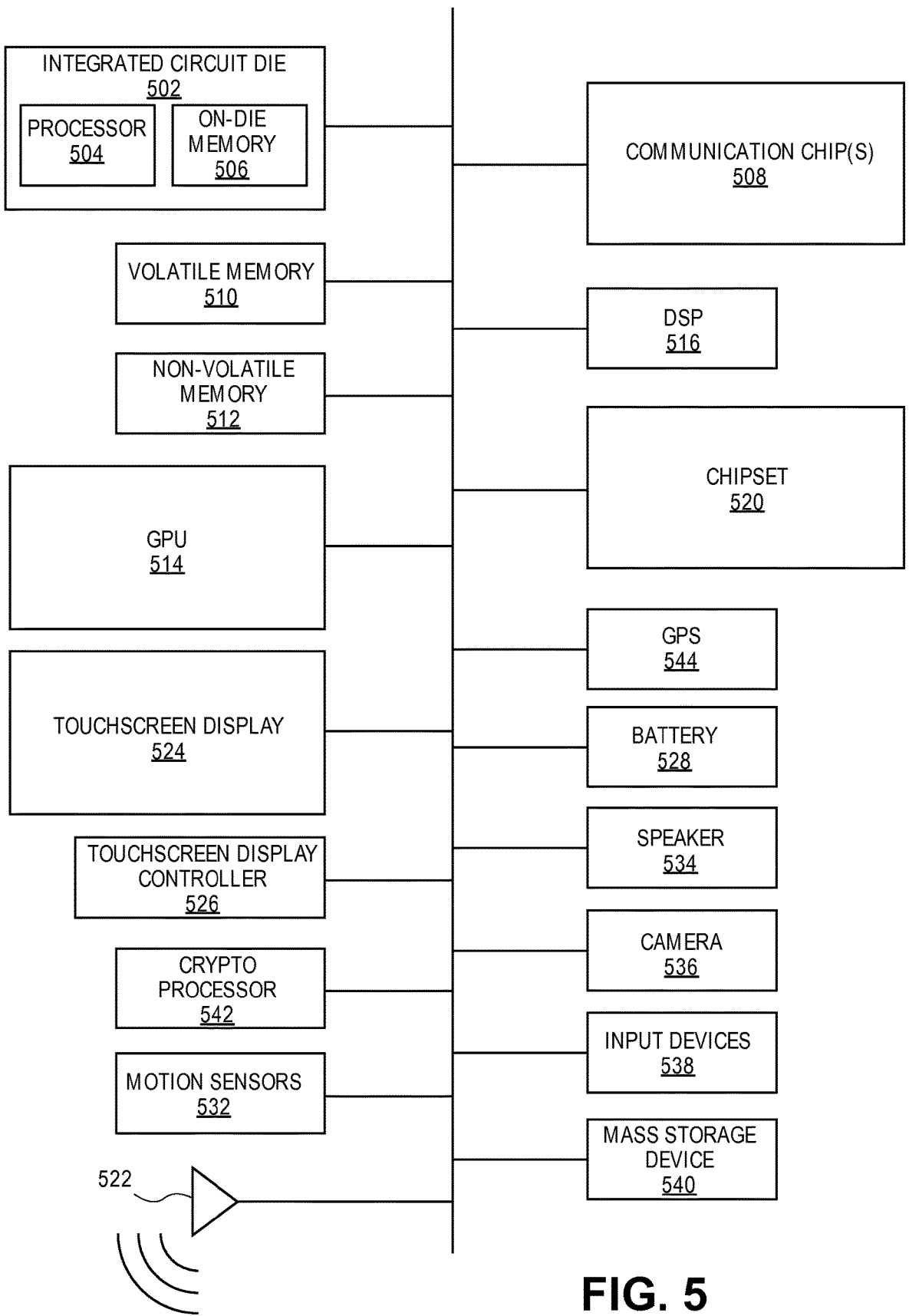
FIG. 5 is a schematic of a computing device that includes one or more transistors built in accordance with an embodiment of the invention.

FIG. 5 illustrates a computing device 500 in accordance with one embodiment of the invention. The computing device 500 may include a number of components. In one embodiment, these components are attached to one or more motherboards. In an alternate embodiment, these components are fabricated onto a single system-on-a-chip (SoC) die rather than a motherboard. The components in the computing device 500 include, but are not limited to, an integrated circuit die 502 and at least one communication chip 508. In some implementations the communication chip 508 is fabricated as part of the integrated circuit die 502. The integrated circuit die 502 may include a CPU 504 as well as on-die memory 506, often used as cache memory, that can be provided by technologies such as embedded DRAM (eDRAM) or spin-transfer torque memory (STTM or STTM-RAM).

Computing device 500 may include other components that may or may not be physically and electrically coupled to the motherboard or fabricated within an SoC die. These other components include, but are not limited to, volatile memory 510 (e.g., DRAM), non-volatile memory 512 (e.g., ROM or flash memory), a graphics processing unit 514 (GPU), a digital signal processor 516, a crypto processor 542 (a specialized processor that executes cryptographic algorithms within hardware), a chipset 520, an antenna 522, a display or a touchscreen display 524, a touchscreen controller 526, a battery 528 or other power source, a power amplifier (not shown), a global positioning system (GPS) device 528, a compass 530, a motion coprocessor or sensors 532 (that may include an accelerometer, a gyroscope, and a compass), a speaker 534, a camera 536, user input devices 538 (such as a keyboard, mouse, stylus, and touchpad), and a mass storage device 540 (such as hard disk drive, compact disk (CD), digital versatile disk (DVD), and so forth).

The communications chip 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 508. For instance, a first communication chip 508 may be dedicated to shorter range wireless communications such as Wi-Fi and Bluetooth and a second communication chip 508 may be dedicated to longer range wireless communications such as GPS, EDGE, GPRS, CDMA, WiMAX, LTE, Ev-DO, and others.

The processor 504 of the computing device 500 includes one or more devices, such as vertically oriented long channel transistors, according to an embodiment of the invention. The term "processor" may refer to any device or portion of a device that processes electronic data from registers and/or memory to transform that electronic data into other electronic data that may be stored in registers and/or memory.

The communication chip 508 may also include one or more devices, such as vertically oriented long channel transistors, according to an embodiment of the invention.

In further embodiments, another component housed within the computing device 500 may contain one or more devices, such as vertically oriented long channel transistors, according to an embodiment of the invention.

In various embodiments, the computing device 500 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include a method of forming a transistor that comprises: forming a fin on a semiconductor substrate; forming a spacer over an upper portion of the fin, wherein the lower portion of the fin is exposed; forming a gate dielectric layer over the exposed lower portion of the fin; forming a gate electrode in contact with the gate dielectric layer; exposing a top portion of the fin; forming a first source/drain (S/D) region in the top portion of the fin; removing the semiconductor substrate, wherein the removal of the semiconductor substrate exposes a bottom portion of the fin; and forming a second S/D region in the bottom portion of the fin, wherein the formation of the second S/D region defines a channel between the first and second S/D regions.

Additional embodiments of the invention include a method, further comprising: forming a trench isolation oxide along the sidewalls of the fin prior to forming the spacer; and recessing the trench isolation oxide to expose the upper portion of the fin.

Additional embodiments of the invention include a method, wherein the distance the trench isolation oxide is recessed controls the gate length of the transistor.

Additional embodiments of the invention include a method, wherein forming the first S/D region comprises doping the fin.

Additional embodiments of the invention include a method, wherein forming the first S/D region comprises: recessing the top portion of the fin; and epitaxially growing the first S/D region.

Additional embodiments of the invention include a method, wherein the first S/D region is in situ doped during the epitaxial growth.

Additional embodiments of the invention include a method, wherein the top portion of the fin is exposed prior to forming the gate dielectric over the lower portion of the fin.

Additional embodiments of the invention include a method, wherein the first S/D region is formed prior to forming the gate dielectric over the lower portion of the fin.

Additional embodiments of the invention include a method, further comprising: planarizing the gate electrode with a top surface of the spacer; recessing the gate electrode to expose an upper portion of the spacer; and depositing an interlayer dielectric (ILD) material over the gate electrode and the upper portion of the spacer.

Additional embodiments of the invention include a method, further comprising: planarizing the ILD material with the top surface of the spacer prior to exposing the top portion of the fin.

Additional embodiments of the invention include a method, further comprising: removing the ILD material from over the gate electrode after forming the first S/D regions; and forming gate contact regions over the gate electrode.

Additional embodiments of the invention include a method, wherein removing the semiconductor substrate exposes a surface of the gate electrode.

Additional embodiments of the invention include a method, further comprising: recessing the gate electrode; and forming a second spacer over the gate electrode.

Additional embodiments of the invention include a method, further comprising: forming a first S/D contact region over the first S/D region; and forming a second S/D contact region over the second S/D region.

Additional embodiments of the invention include a method, wherein the processing operations used to form the transistor may also be used to form horizontal non-planar transistors on the same substrate.

Additional embodiments of the invention include a method, wherein the horizontal non-planar transistors are tri-gate transistors or nanowire transistors.

Embodiments of the invention include a non-planar transistor device, comprising: a first source/drain (S/D) region; a semiconductor channel formed over the first S/D region; a second S/D region formed over the semiconductor channel, wherein the first S/D region, the channel, and the second S/D region are aligned in the vertical direction with sidewalls that are substantially coplanar; a gate dielectric layer formed along two or more sidewalls of the semiconductor channel; and a gate electrode separated from the semiconductor channel by the gate dielectric layer.

Additional embodiments of the invention include a non-planar transistor device, wherein the gate dielectric is formed along all of the sidewalls of the channel, and wherein the gate electrode encircles the semiconductor channel.

Additional embodiments of the invention include a non-planar transistor device, wherein the gate dielectric is formed along two or more sidewalls of the first S/D region.

Additional embodiments of the invention include a non-planar transistor device, further comprising spacers formed along two or more of the sidewalls of the second S/D region.

Additional embodiments of the invention include a non-planar transistor device, further comprising a gate contact electrically coupled to the gate electrode, wherein the gate contact is separated from the second S/D region by the spacers formed along the two or more sidewalls of the second S/D region.

Additional embodiments of the invention include a non-planar transistor device, further comprising a first S/D contact region formed on the first S/D region, and a second S/D contact region formed on the second S/D region, wherein sidewalls of the first and second S/D regions are substantially coplanar with sidewalls of the first and second S/D regions.

Additional embodiments of the invention include a non-planar transistor device, wherein the channel has a length greater than approximately 10 nm.

Additional embodiments of the invention include a non-planar transistor device, wherein the first and second S/D regions are epitaxially grown semiconductors.

Embodiments of the invention include a method of forming a transistor, comprising: forming a fin on a semiconductor substrate; forming a trench isolation oxide along the sidewalls of the fin; recessing the trench isolation oxide to expose an upper portion of the fin; forming a spacer over the upper portion of the fin; removing the trench isolation oxide to expose a lower portion of the fin; forming a gate dielectric layer over the exposed lower portion of the fin; forming a gate electrode in contact with the gate dielectric layer; recessing the gate electrode, wherein an upper surface of the gate electrode is below a top surface of the spacer; exposing a top portion of the fin; forming a first source/drain (S/D) region and a first S/D contact region in the top portion of the fin; forming a gate contact over the upper surface of the gate electrode; removing the semiconductor substrate, wherein the removal of the semiconductor substrate exposes a bottom portion of the fin; and forming a second S/D region and a second S/D contact region in the bottom portion of the fin, wherein the formation of the second S/D region defines a channel between the first and second S/D regions.

Additional embodiments of the invention include a method of forming a transistor, wherein the top portion of the fin is exposed prior to forming the gate dielectric over the lower portion of the fin.

Additional embodiments of the invention include a method of forming a transistor, wherein the first S/D region is formed prior to forming the gate dielectric over the lower portion of the fin.

Additional embodiments of the invention include a method of forming a transistor, wherein the processing operations used to form the transistor may also be used to form horizontal non-planar transistors on the same substrate.

Additional embodiments of the invention include a method of forming a transistor, wherein the horizontal non-planar transistors are tri-gate transistors or nanowire transistors.

What is claimed is:

1. A method of forming a transistor, comprising:
forming a fin on a semiconductor substrate;
forming a spacer over an upper portion of the fin, wherein a lower portion of the fin is exposed;
forming a gate dielectric layer over the exposed lower portion of the fin;
forming a gate electrode in contact with the gate dielectric layer;
exposing a top portion of the fin;
forming a first source/drain (S/D) region in the top portion of the fin;
removing the semiconductor substrate, wherein the removal of the semiconductor substrate exposes a bottom portion of the fin; and
forming a second S/D region in the bottom portion of the fin, wherein the formation of the second S/D region defines a channel between the first and second S/D regions.

2. The method of claim 1, further comprising:
forming a trench isolation oxide along sidewalls of the fin prior to forming the spacer; and
recessing the trench isolation oxide to expose the upper portion of the fin.

3. The method of claim 2, wherein a distance the trench isolation oxide is recessed controls the gate length of the transistor.

4. The method of claim 1, wherein forming the first S/D region comprises doping the fin.

5. The method of claim 1, wherein forming the first S/D region comprises:
recessing the top portion of the fin; and
epitaxially growing the first S/D region.

6. The method of claim 1, wherein the top portion of the fin is exposed prior to forming the gate dielectric layer over the lower portion of the fin.

7. The method of claim 6, wherein the first S/D region is formed prior to forming the gate dielectric layer over the lower portion of the fin.

8. The method of claim 1, further comprising:
planarizing the gate electrode with a top surface of the spacer;
recessing the gate electrode to expose an upper portion of the spacer; and depositing an interlayer dielectric (ILD) material over the gate electrode and the upper portion of the spacer.

9. The method of claim 8, further comprising:
planarizing the ILD material with the top surface of the spacer prior to exposing the top portion of the fin.

10. The method of claim 9, further comprising:
removing the ILD material from over the gate electrode after forming the first S/D region; and
forming gate contact regions over the gate electrode.

11. The method of claim 1, wherein removing the semiconductor substrate exposes a surface of the gate electrode.

12. The method of claim 11, further comprising:
recessing the gate electrode; and
forming a second spacer over the gate electrode.

13. The method of claim 1, further comprising:
forming a first S/D contact region over the first S/D region; and
forming a second S/D contact region over the second S/D region.

14. A non-planar transistor device, comprising:
a first source/drain (S/D) region;
a semiconductor channel formed over the first S/D region;
a second S/D region formed over the semiconductor channel, wherein the first S/D region, the semiconductor channel, and the second S/D region are aligned in a vertical direction with respective sidewalls that are substantially coplanar;
a gate dielectric layer formed along two or more sidewalls of the semiconductor channel;
a gate electrode separated from the semiconductor channel by the gate dielectric layer;
a first S/D contact region formed on the first S/D region, wherein sidewalls of the first S/D contact region are substantially coplanar with sidewalls of the first S/D region; and
a second S/D contact region formed on the second S/D region, wherein sidewalls of the second S/D contact region are substantially coplanar with sidewalls of the second S/D region.

15. The non-planar transistor device of claim 14, wherein the gate dielectric layer is formed along all of the sidewalls of the semiconductor channel, and wherein the gate electrode encircles the semiconductor channel.

16. The non-planar transistor device of claim 14, wherein the gate dielectric layer is formed along two or more sidewalls of the first S/D region.

17. The non-planar transistor of claim 16, further comprising spacers formed along two or more of the sidewalls of the second S/D region.

18. The non-planar transistor of claim 17, further comprising a gate contact electrically coupled to the gate electrode, wherein the gate contact is separated from the second S/D region by the spacers formed along the two or more sidewalls of the second S/D region.

19. The non-planar transistor of claim 14, wherein the semiconductor channel has a length greater than approximately 10 nm.

20. A method of forming a transistor, comprising:
forming a fin on a semiconductor substrate;
forming a trench isolation oxide along sidewalls of the fin;
recessing the trench isolation oxide to expose an upper portion of the fin;
forming a spacer over the upper portion of the fin;
removing the trench isolation oxide to expose a lower portion of the fin;
forming a gate dielectric layer over the exposed lower portion of the fin;
forming a gate electrode in contact with the gate dielectric layer;
recessing the gate electrode, wherein an upper surface of the gate electrode is below a top surface of the spacer;
exposing a top portion of the fin;
forming a first source/drain (S/D) region and a first S/D contact region in the top portion of the fin;
forming a gate contact over the upper surface of the gate electrode;
removing the semiconductor substrate, wherein the removal of the semiconductor substrate exposes a bottom portion of the fin; and
forming a second S/D region and a second S/D contact region in the bottom portion of the fin, wherein the formation of the second S/D region defines a channel between the first and second S/D regions.

* * * * *